US012563947B2

(12) United States Patent
Hyun et al.

(10) Patent No.: US 12,563,947 B2
(45) Date of Patent: Feb. 24, 2026

(54) DISPLAY DEVICE AND METHOD OF FABRICATING THE SAME

(71) Applicant: Samsung Display Co., LTD., Yongin-si (KR)

(72) Inventors: Jin Ho Hyun, Gwacheon-si (KR); Kwan Hyuck Yoon, Seoul (KR); Hye Min Lee, Gimpo-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 528 days.

(21) Appl. No.: 17/962,013

(22) Filed: Oct. 7, 2022

(65) Prior Publication Data

US 2023/0133488 A1     May 4, 2023

(30) Foreign Application Priority Data

Nov. 2, 2021    (KR) ........................ 10-2021-0148885

(51) Int. Cl.
*H10K 59/80*          (2023.01)
*H10K 71/00*          (2023.01)

(52) U.S. Cl.
CPC ........... *H10K 59/873* (2023.02); *H10K 71/00* (2023.02)

(58) Field of Classification Search
CPC ....... H01L 21/4875; H01L 2224/48175; H01L 2224/85007; H01L 23/3107;

(Continued)

(56) References Cited

U.S. PATENT DOCUMENTS

| | | | |
|---|---|---|---|
| 9,818,807 B2 | 11/2017 | Park | |
| 10,135,025 B2 | 11/2018 | Kim et al. | |

(Continued)

FOREIGN PATENT DOCUMENTS

| | | |
|---|---|---|
| KR | 1020160087982 A | 7/2016 |
| KR | 1020170096646 A | 8/2017 |

(Continued)

OTHER PUBLICATIONS

Evangelos Gogolides, et al., "Controlling Roughness: From Etching To Nanotexturing and Plasma-Directed Organization on Organic and Inorganic Materials", J. Phys. D: Appl. Phys., (2011), vol. 44, pp. 174021.

*Primary Examiner* — Shaun M Campbell
(74) *Attorney, Agent, or Firm* — CANTOR COLBURN LLP

(57) ABSTRACT

A display device includes a substrate including a display area and a non-display area surrounding the display area, a plurality of pixels on the substrate in the display area, a first encapsulation layer on the substrate to cover the pixels and including an inorganic material, a second encapsulation layer on the first encapsulation layer and including an organic material, and a third encapsulation layer on the second encapsulation layer and including an inorganic material. An edge of the second encapsulation layer is located in the non-display area, edges of the first encapsulation layer and the third encapsulation layer are located more to an outside than the edge of the second encapsulation layer is. The first encapsulation layer includes a first area and a second area located more to the outside than the first area and having a surface roughness smaller than a surface roughness of the first area.

14 Claims, 16 Drawing Sheets

(58) Field of Classification Search
CPC ............. H01L 23/3121; H01L 23/3672; H01L
23/4334; H01L 23/49513; H01L
23/49541; H01L 23/49568; H01L
23/49575; H01L 24/48; H01L 24/85
See application file for complete search history.

(56) References Cited

U.S. PATENT DOCUMENTS

| | | | |
|---|---|---|---|
| 10,529,952 B2 | 1/2020 | Kim et al. | |
| 10,714,707 B2 | 7/2020 | Kim et al. | |
| 10,916,603 B2 | 2/2021 | Park et al. | |
| 11,251,401 B2 | 2/2022 | Kim et al. | |
| RE49,204 E | 9/2022 | Park | |
| 11,737,311 B2 | 8/2023 | Kim et al. | |
| 12,089,434 B2 | 9/2024 | Kim et al. | |
| RE50,265 E | 1/2025 | Park | |
| 2017/0062537 A1* | 3/2017 | Kim | ................... H10K 59/8731 |
| 2017/0069873 A1* | 3/2017 | Kim | ..................... H10K 50/844 |
| 2019/0019983 A1* | 1/2019 | Kim | ..................... H10K 50/805 |
| 2019/0198587 A1* | 6/2019 | Park | .................. H10K 50/8445 |
| 2025/0008768 A1 | 1/2025 | Kim et al. | |

FOREIGN PATENT DOCUMENTS

| | | |
|---|---|---|
| KR | 1020180014398 | 2/2018 |
| KR | 1020190076093 | 7/2019 |
| KR | 1020190081724 | 7/2019 |

* cited by examiner

FIG. 5

DISPLAY DEVICE AND METHOD OF FABRICATING THE SAME

This application claims priority to Korean Patent Application No. 10-2021-0148885, filed on Nov. 2, 2021, and all the benefits accruing therefrom under 35 U.S.C. § 119, the content of which in its entirety is herein incorporated by reference.

BACKGROUND

1. Field

The disclosure relates to a display device, and a method of fabricating the display device.

2. Description of the Related Art

Electronic devices that displays images to a user such as a smart phone, a tablet personal computer ("PC"), a digital camera, a laptop computer, a navigation device and a smart television ("TV") include a display device for displaying images. A display device may include organic light-emitting elements that emit light as electrons and holes recombine to display images.

During the process of fabricating an organic light-emitting diode display, a plurality of pixels, each including light-emitting elements, may be formed on a substrate, and then a thin-film encapsulation layer may be provided on the substrate to cover the pixels. The thin-film encapsulation layer may include an inorganic insulating layer and an organic insulating layer.

SUMMARY

In a process of forming an organic insulating layer of a thin-film encapsulation layer of an organic light-emitting diode display, an organic material having flowability may be provided on a substrate, and the organic material may be cured to form the organic insulating layer. When the organic material having flowability is provided on the substrate, the organic material may not spread uniformly or may flow over the substrate.

Embodiments of the disclosure provide a display device including an organic film having improved the uniformity and in which Mura defects are prevented, and a method of fabricating the display device.

Embodiments of the disclosure also provide a display device in which an organic material may be effectively formed at a desired location and the organic material does not flow over the substrate, and a method of fabricating the display device.

According to an embodiment of the disclosure, a display device includes a substrate including a display area and a non-display area surrounding the display area, a plurality of pixels disposed on the substrate in the display area, a first encapsulation layer disposed on the substrate to cover the pixels, where the first encapsulation layer includes an inorganic material, a second encapsulation layer disposed on the first encapsulation layer, where the second encapsulation layer includes an organic material, and a third encapsulation layer disposed on the second encapsulation layer and comprising an inorganic material, where an edge of the second encapsulation layer is located in the non-display area, edges of the first encapsulation layer and the third encapsulation layer are located more to an outside than the edge of the second encapsulation layer is, the first encapsulation layer includes a first area having a first surface roughness and a second area having a second surface roughness smaller than the first surface roughness, and the second area is located more to the outside than the first area is.

In an embodiment, an edge of the first area may be located on an inner surface of a first dam member.

In an embodiment, the first area may overlap the second encapsulation layer, and the second area may not overlap the second encapsulation layer.

In an embodiment, the edge of the first area may be aligned with the second encapsulation layer.

In an embodiment, a thickness of the first area may be smaller than a thickness of the second area by about 50 angstroms to about 100 angstroms.

In an embodiment, the first surface roughness may be greater than the second surface roughness by about 5 nanometers to about 10 nanometers.

According to another embodiment of the disclosure, a display device includes a substrate including a display area and a non-display area surrounding the display area, a plurality of pixels disposed on the substrate in the display area, a first dam member disposed on the substrate in the non-display area, a first encapsulation layer covering the pixels and the first dam member, where an edge of the first encapsulation layer is located on an outer side of the first dam member, and a second encapsulation layer disposed on the first encapsulation layer and covering the pixels, where an edge of the second encapsulation layer is located on the first dam member. In such an embodiment, the first encapsulation layer includes a first area disposed across the display area and the non-display area and, and a second area disposed on an outer side of the first area, the first area has a first roughness and the second area has a second roughness different from the first roughness, and a boundary between the first area and the second area overlaps the first dam member.

In an embodiment, a boundary between the first area and the second area may be located on an inner surface of the first dam member.

In an embodiment, the first area may overlap the second encapsulation layer, and the second area may not overlap the second encapsulation layer.

In an embodiment, the boundary between the first area and the second area may be aligned with the edge of the second encapsulation layer.

In an embodiment, a thickness of the first area may be smaller than a thickness of the second area by about 50 angstroms to about 100 angstroms.

In an embodiment, the first surface roughness may be greater than the second surface roughness by about 5 nanometers to about 10 nanometers.

In an embodiment, the display device further include a second dam member disposed on the outer side of the first dam member, where a height of the second dam member may be greater than a height of the first dam member.

In an embodiment, the display device further include a third encapsulation layer disposed on the second encapsulation layer to cover the second encapsulation layer and the first dam member, where an edge of the third encapsulation layer may be located on the outer side of the first dam member.

According to an embodiment of the disclosure, a method of fabricating a display device includes preparing a substrate including a display area, in which a plurality of pixels is disposed, and a non-display area surrounding the display area, providing a first encapsulation layer comprising a first inorganic material on the substrate to cover the pixels, where the first encapsulation layer includes a first area extended from the display area to a part of the non-display area and a second area on an outer side of the first area, partially etching the first area of the first encapsulation layer in a way such that a surface roughness of the first area is greater than a surface roughness of the second area, and providing a second encapsulation layer comprising an organic material on the first area of the first encapsulation layer.

In an embodiment, the partially etching may include, placing an etching mask above the first encapsulation layer to expose the first area and to mask the second area, and performing etching using an etching gas including fluorine element.

In an embodiment, further comprising, after the partially etching, cleaning a residue of the fluorine element.

In an embodiment, a thickness of the first area may be smaller than a thickness of the second area by about 50 angstroms to about 100 angstroms.

In an embodiment, the surface roughness of the first area may be greater than the surface roughness of the second area by about 5 nanometers to about 10 nanometers.

In an embodiment, the providing the first encapsulation layer may include placing an open mask, in which an opening is defined to expose the first area and the second area above the substrate, and depositing the first inorganic material on the substrate through the open mask.

According to embodiments of the disclosure, the uniformity of an organic film may be improved, and Mura defects in a display device may be effectively prevented. In such embodiments, an organic material may be formed at a desired location and the organic material does not flow over the substrate.

BRIEF DESCRIPTION OF THE DRAWINGS

The above and other features of the disclosure will become more apparent by describing in detail embodiments thereof with reference to the attached drawings, in which:

FIG. 5 is a cross-sectional view taken along line A-A' of FIG. 2;

DETAILED DESCRIPTION

Figure 1A:
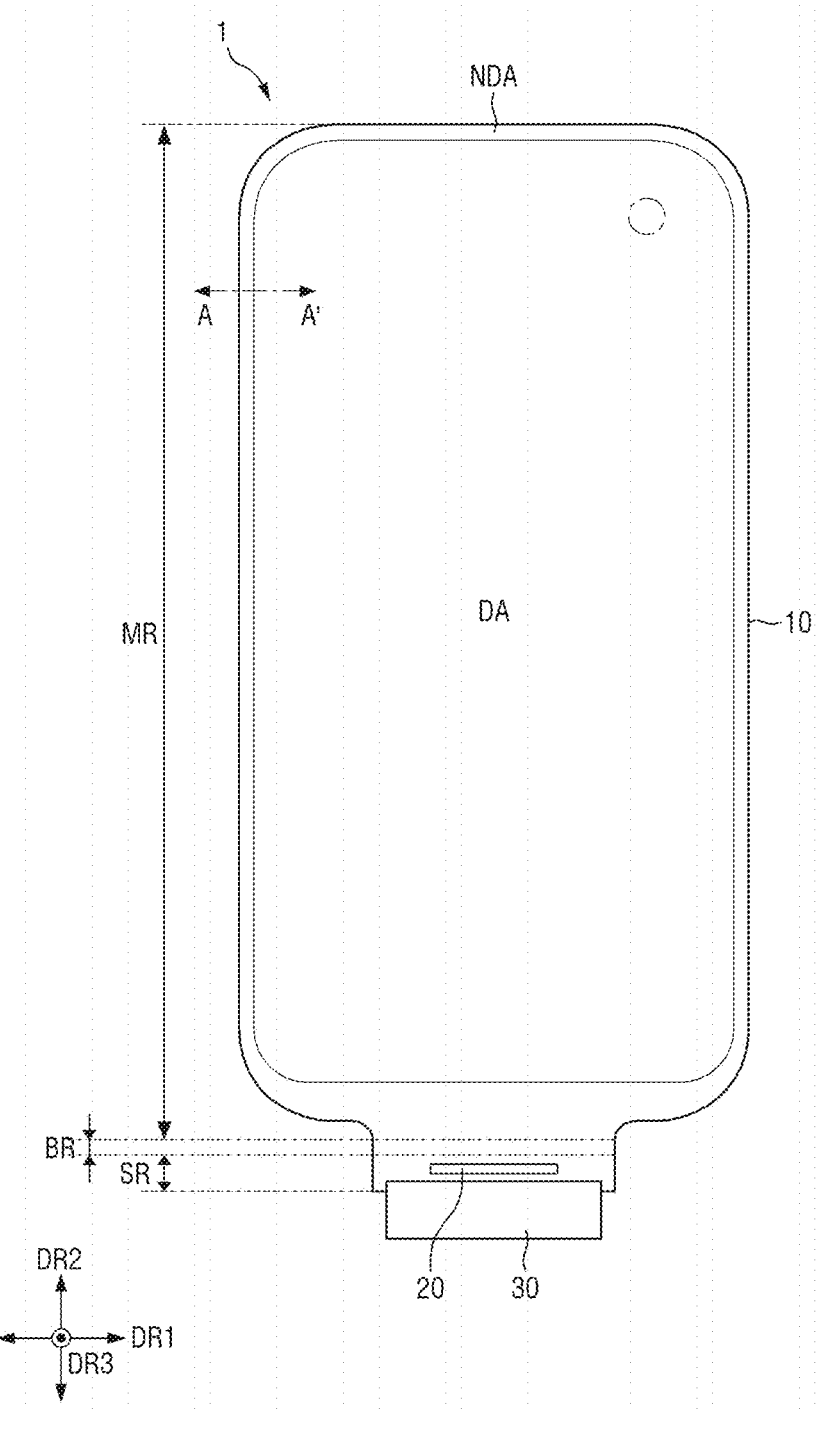
FIG. 1A is a plan view of a display device according to an embodiment of the disclosure.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present therebetween. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the accompanying drawings.

Figure 1B:
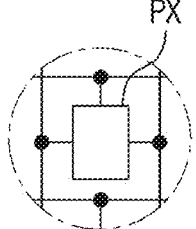
FIG. 1B is an enlarged view of the encircled portion of FIG. 1A.
Figure 2:
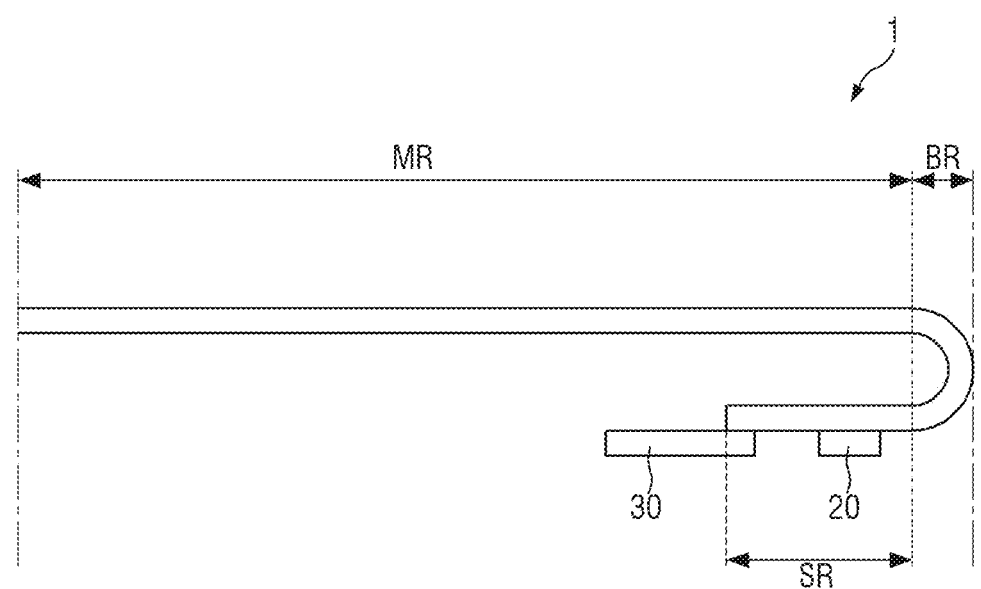
FIG. 2 is a cross-sectional view of a display device according to an embodiment of the disclosure.

FIG. 1A is a plan view of a display device according to an embodiment of the disclosure. FIG. 1B is an enlarged view of the encircled portion of FIG. 1A. FIG. 2 is a cross-sectional view of a display device according to an embodiment of the disclosure.

A first direction DR1 refers to a direction parallel to a side of the display device 1 when viewed from a top (or a top plan view), i.e., a shorter side direction of the display device 1. A second direction DR2 refers to a direction parallel to another side of the display device 1 that meets the side when viewed from the top, i.e., a longer side direction of the display device 1. A third direction DR3 may refer to a thickness direction of the display device 1. Here, the top plan view may be a plan view in the third direction DR3. It would be understood that the directions referred to in the embodiments are relative directions, and the embodiments are not limited to the directions mentioned.

Referring to FIGS. 1A, 1B and 2, an embodiment of a display device 1 may refer to any electronic device including a display screen. The display device 1 may include portable electronic devices including a display screen, such as a mobile phone, a smart phone, a tablet personal computer ("PC"), an electronic watch, a smart watch, a watch phone, a mobile communications terminal, an electronic notebook, an electronic book, a portable multimedia player ("PMP"), a navigation device, a game console and a digital camera, as well as a television set, a laptop computer, a monitor, an electronic billboard, the Internet of Things devices ("IoT"), etc.

The display device 1 may include a display area DA where images are displayed, and a non-display area NDA where no image is displayed.

The shape of the display area DA may be a rectangle or a rectangle with rounded corners. In an embodiment, as shown in FIG. 1A, the shape of the display area DA is a rectangle that has rounded corners and has its sides in the first direction DR1 longer than its sides in the second direction DR2. It is, however, to be understood that the disclosure is not limited thereto. The display area DA may have various shapes such as a rectangular shape with sides in the second direction DR2 longer than sides thereof in the first direction DR1, a square shape, other polygonal shapes, a circular shape, or an elliptical shape.

Figure 3:
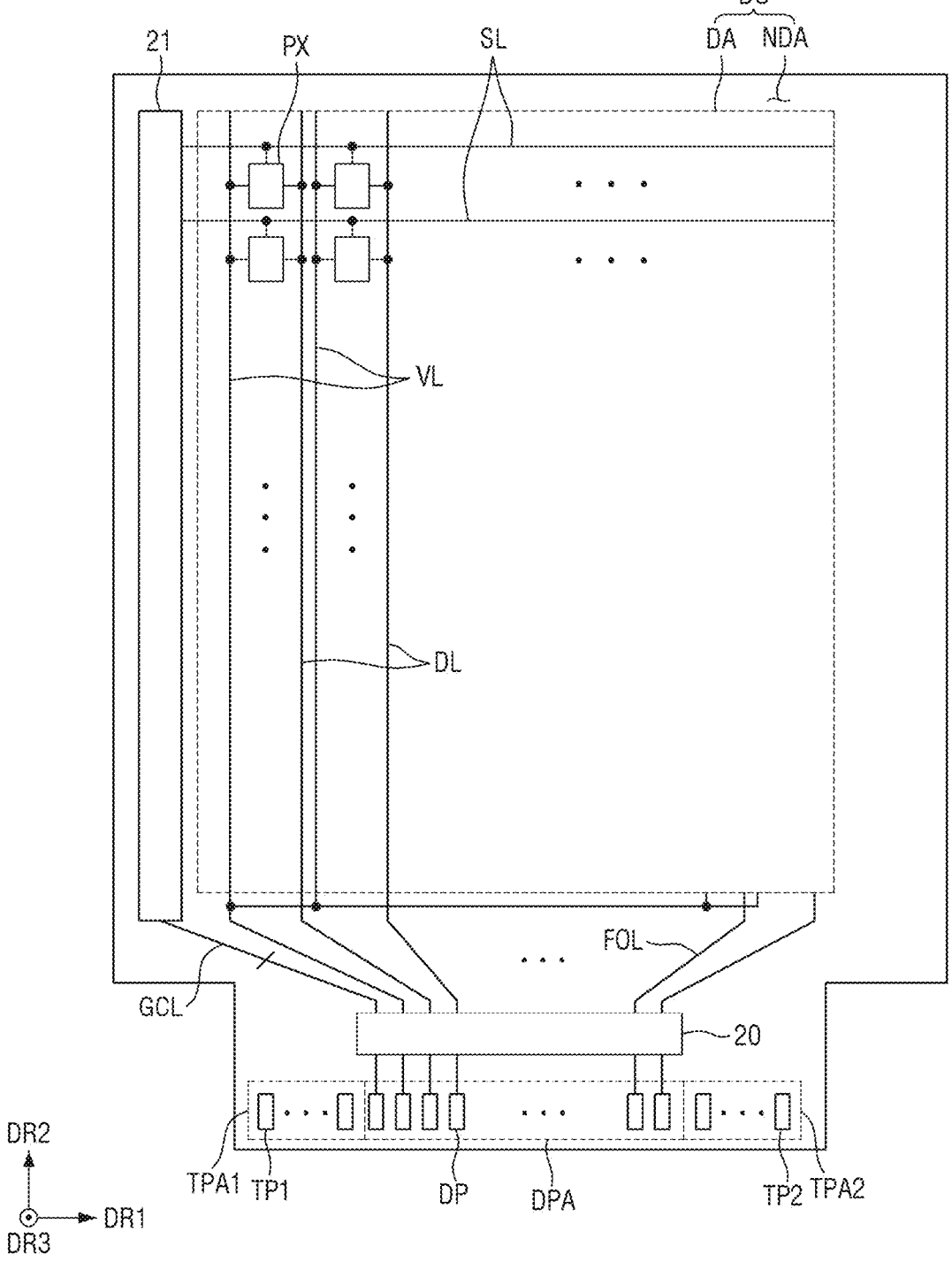
FIG. 3 is a plan view schematically showing the arrangement of the elements of a display device according to an embodiment of the disclosure.

The non-display area NDA may surround the display area DA. The non-display area NDA may be a bezel. The non-display area NDA may surround all of the sides (four sides in the drawings) of the display area DA as shown in FIGS. 1A and 3. It is, however, to be understood that the disclosure is not limited thereto. In an alternative embodiment, for example, the non-display area NDA may not be disposed near the upper side of the display area DA or near the left or right side thereof.

In the non-display area NDA, signal lines for applying signals to the display area DPA or driving circuits may be disposed. The signal lines will be described in detail later with reference to FIG. 3.

The display device 1 includes a display panel 10 for providing a display screen. In an embodiment, the display panel 10 may include an organic light-emitting display panel, a micro light emitting diode ("LED") display panel, a nano LED display panel, a quantum-dot display panel, a liquid-crystal display panel, a plasma display panel, a field emission display panel, an electrophoretic display panel, an electrowetting display panel, etc. Hereinafter, for convenience of description, embodiments where the display panel 10 is an organic light-emitting display panel will be described in detail, but the disclosure is not limited thereto. Any other types of display panel may be employed without departing from the teachings herein.

The display panel 10 may include a plurality of pixels PX. The plurality of pixels PX may be arranged in a matrix. In an embodiment, as shown in FIG. 1B, the shape of each pixel may be, but is not limited to, a rectangle or a square when viewed from the top. Each pixel may have a diamond shape having sides inclined with respect to the first direction DR1. Each pixel may include an emission area. Each emission area may have a same shape as or a different shape from the shape of the pixels. In an embodiment, for example, where the pixels have a rectangular shape, the shape of the emission area of each of the pixels may have various shapes such as a rectangle, a diamond, a hexagon, an octagon, and a circle.

In an embodiment, the display panel 10 may include a flexible substrate including a flexible polymer material such as PI. Accordingly, in such an embodiment, the display panel 10 may be curved, bent, folded, or rolled.

Referring to FIGS. 1A and 2, an embodiment of the display panel 10 may include a bending region BR that is a bendable part of the display panel 10. The display panel 10 may be divided into a main region MR located on one side of the bending region BR and a sub-region SR located on the other side of the bending region BR.

The display area DA of the display panel 10 may be disposed in the main region MR. According to an embodiment of the disclosure, the edges of the main region MR around the display area DA, the entire bending region BR and the entire sub-region SR may be the non-display area NDA. It is, however, to be understood that the disclosure is not limited thereto. In an alternative embodiment, the bending region BR and/or the sub-region SR may also include the display area DA.

The bending region BR may be connected to one side of the main region MR in the first direction DR1. In an embodiment, for example, the bending region BR may be connected to the lower shorter side of the main region MR. The width of the bending region BR may be less than the width (width of the shorter side) of the main region MR. The portions where the main region MR meets the bending region BR may be cut in an L-like shape when viewed from the top.

In the bending region BR, the display panel 10 may be bent downward in the thickness direction, i.e., in the direction away from the display surface. In an embodiment, the bending region BR may have a constant radius of curvature, but the disclosure is not limited thereto. In an alternative embodiment, the bending region BR may have different radii of curvature for difference sections. As the display panel 10 is bent at the bending region BR, the surface of the display panel 10 may be reversed. In an embodiment, the surface of the display panel 10 facing upward may be bent such that it faces outward at the bending region BR and then faces downward.

The sub-region SR is extended from the bending region BR. The sub-region SR may be extended in a direction parallel to the main region MR from the end of the bending region. The sub region SR may overlap the main region MR in the thickness direction of the display panel 10. A width of the sub-region SR (i.e., a length in the first direction DR1) may be, but is not limited to being, equal to a width of the bending region BR.

In an embodiment, a display driver 20 may be disposed in the sub-region SR The display driver 20 may include an integrated circuit for driving the display panel 10. The integrated circuit may include an integrated circuit for a display. The integrated circuit for a display may be implemented as a separate chip or may be integrated into a single chip.

A pad area may be disposed at the end of the sub-region SR of the display panel 10. The pad area may include display signal line pads and touch signal line pads. A circuit board 30 may be connected to the pad area at the end of the sub-region SR of the display panel 10. The circuit board 30 may be a flexible printed circuit board or a film.

FIG. 3 is a plan view schematically showing the arrangement of the elements of a display device according to an embodiment of the disclosure.

In an embodiment, a display device may include a display unit DU including a display area DA and a non-display area NDA. In an embodiment, the display area DA may include a plurality of pixels PX, and a plurality of scan lines SL, a plurality of data lines DL and a plurality of voltage lines VL, which are connected to the pixels PX.

The plurality of scan lines SL may supply the gate signals received from the gate driver 21 to the plurality of pixels PX. The plurality of scan lines SL may be extended in the first direction DR1 and may be spaced apart from one another in the second direction DR2 intersecting the first direction DR1.

The plurality of data lines DL may supply data signals received from the display driver 20 to the plurality of pixels PX. The plurality of data lines DL may be extended in the second direction DR2 and may be spaced apart from one another in the first direction DR1.

The non-display area NDA may include a gate driver 21 for applying gate signals to the plurality of scan lines SL, fan-out lines FOL for connecting the plurality of data lines DL with the display driver 20, and a display pad area DP connected to circuit board 30.

The display driver 20 may supply a gate driver control signal to the gate driver 21 through the gate control lines GCL. The gate driver 21 may generate a plurality of gate signals based on the gate driver control signal, and may sequentially supply the plurality of gate signals to the plurality of scan lines SL in a predetermined order.

A display pad area DPA may be located at an edge of the display panel 10 and may include a plurality of display pads DP. The plurality of display pads DP may be connected to a main processor through the circuit board 30 and may be connected to the circuit board 30 to receive digital video data, and may supply the digital video data to the display driver 20. In an embodiment, the edge of the display panel 10 may further include test pad areas TPA1 and TPA2 at opposing sides of the display pad area DPA, respectively, and the test pad areas TPA1 and TP2 may include test pads TP1 and TP2.

Figure 4:
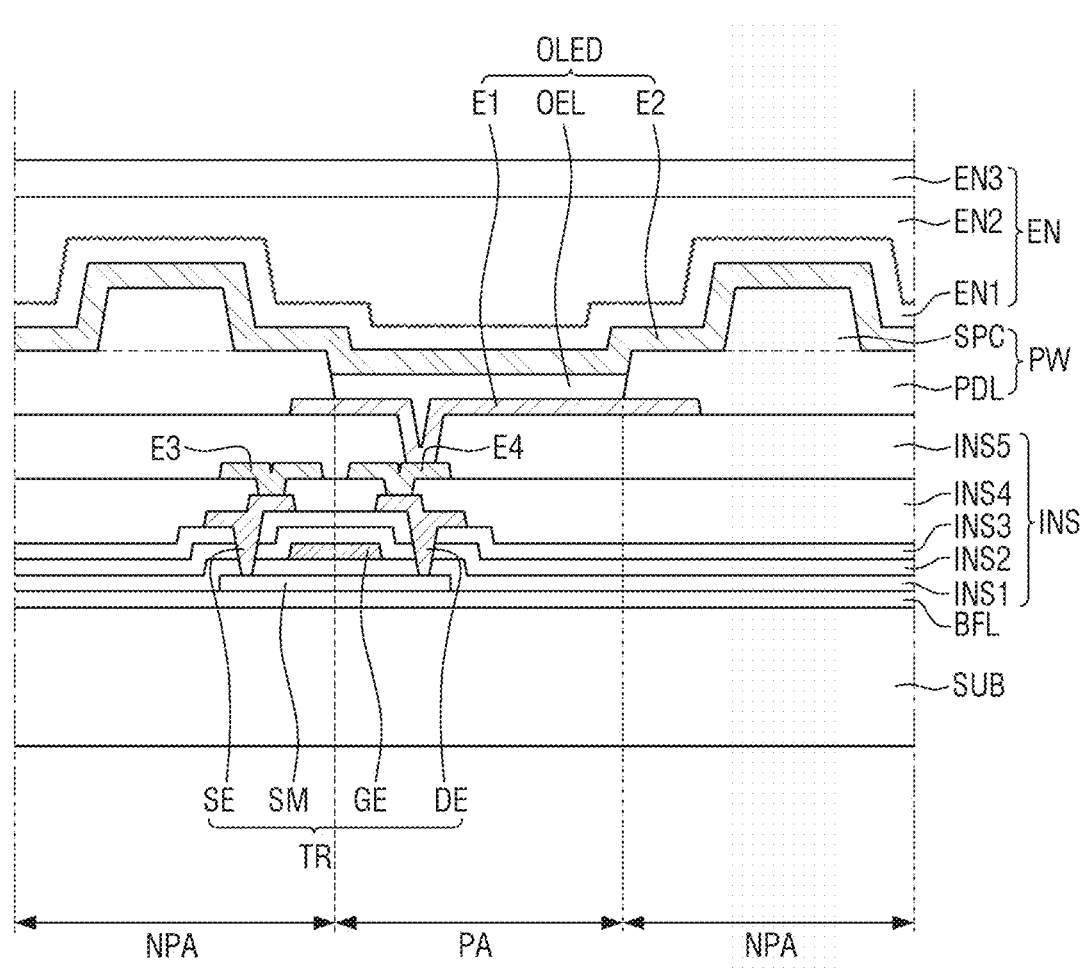
FIG. 4 is a cross-sectional view of a pixel of a display device according to an embodiment of the disclosure.

Hereinafter, a cross-sectional structure of an embodiment of the display device will be described. Initially, a cross-sectional structure of a pixel in the display area DA of the display device will be described. FIG. 4 is a cross-sectional view of a pixel of a display device according to an embodiment of the disclosure.

Referring to FIG. 4, in an embodiment, the display device 1 includes a substrate SUB, a buffer layer BFL, a transistor TR, insulating layers INS, a data line E3, a connection electrode E4, a light-emitting element OLED, a pixel partition wall layer PW, and a thin-film encapsulation layer EN.

Each of the layers described above may be defined by be made up of a single film, or a stack of multiple films. In such an embodiment, other layers may be further disposed between the layers.

The substrate SUB supports the layers disposed thereon. The substrate SUB may include or be made of an insulating material such as a polymer resin. In an embodiment, the polymer material of the substrate SUB may include polyethersulphone ("PES"), polyacrylate ("PA"), polyacrylate resin ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose tri acetate ("CAT"), cellulose acetate propionate ("CAP") or a combination thereof. The substrate SUB may be a flexible substrate that can be bent, folded, or rolled. In an embodiment, a material of the flexible substrate may be, but is not limited to, PI.

The buffer layer BFL may be disposed on the substrate SUB. The buffer layer BFL may prevent impurity ions from diffusing, may prevent permeation of moisture or outside air, and may provide a flat surface. The buffer layer BFL may include silicon nitride, silicon oxide, silicon oxynitride, or the like. The buffer layer BFL may be omitted depending on the type of the substrate SUB, process conditions, etc.

The transistor TR may include a semiconductor layer SM, a gate electrode GE, a source electrode SE, and a drain electrode DE. The insulating layer INS may include a first insulating layer INS1, a second insulating layer INS2, a third insulating layer INS3, a fourth insulating layer INS4, and a fifth insulating layer INS5. The transistor TR and the insulating layer INS will be described below.

The semiconductor layer SM is disposed on the buffer layer BFL. The semiconductor layer SM forms a channel of the transistor of the pixel. In an embodiment, the semiconductor layer SM may include polycrystalline silicon, for example. It is, however, to be understood that the disclosure is not limited thereto. The semiconductor layer SM may include monocrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc.

The first insulating layer INS1 may be disposed on the semiconductor layer SM, and the first insulating layer INS1 may be a gate insulating film having a gate insulating function. The first insulating layer INS1 may include a silicon compound, a metal oxide, etc. In an embodiment, for example, the first insulating layer INS1 may include silicon oxide, silicon nitride, silicon oxynitride, aluminum oxide, tantalum oxide, hafnium oxide, zirconium oxide, titanium oxide, etc. These may be used alone or in combinations. The first insulating layer INS1 may be defined by or made up of a single film or multiple films of different materials stacked on one another.

The gate electrode GE is disposed on the first insulating layer INS1. The gate electrode GE may be disposed to overlap the channel region of the semiconductor layer SM. The gate electrode GE may include a gate electrode of the transistor of the pixel, a scan line connected thereto, and a storage capacitor electrode. In an embodiment, a test signal line TS may be further disposed on the first insulating layer INS1.

The gate electrode GE may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The gate electrode GE may be defined by a single layer or a multiple layers.

The second insulating layer INS2 may be disposed on the gate electrode GE. The second insulating layer INS2 may be an interlayer dielectric film. The second insulating layer INS2 may include an inorganic insulating material such as silicon oxide, silicon nitride, silicon oxynitride, hafnium oxide, aluminum oxide, titanium oxide, tantalum oxide and zinc oxide.

The third insulating layer INS3 is disposed on the second insulating layer INS2. The third insulating layer INS3 may be an interlayer dielectric film.

The third insulating layer INS3 may include an inorganic insulating material such as silicon oxide, silicon nitride, silicon oxynitride, hafnium oxide, aluminum oxide, titanium oxide, tantalum oxide and zinc oxide, or an organic insulating material such as polyacrylate resin, epoxy resin, phenolic resin, polyamide resin, PI resin, unsaturated polyesters resin, poly phenylenethers resin, polyphenylenesulfides resin and benzocyclobutene ("BCB"). The third insulating layer INS3 may be defined by or made up of a single film or multiple films of different materials stacked on one another.

The source electrode SE and the drain electrode DE of the transistor TR are disposed on the third insulating layer INS3. The source electrode SE and the drain electrode DE may be source and drain conductive layers, respectively. The source electrode SE and the drain electrode DE of the transistor TR may be electrically connected to the source region and the drain region of the semiconductor layer SM, respectively, through contact holes defined through the third insulating layer IL3, the second insulating layer IL2 and the first insulating layer IL1.

The source electrode SE and the drain electrode DE may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The source electrode SE and the drain electrode DE may be defined by a single film or a stack of multiple films. In an embodiment, for example, the source electrode SE and the drain electrode DE may have a stack structure of Ti/Al/Ti, Mo/Al/Mo, Mo/AlGe/Mo, Ti/Cu, etc.

A fourth insulating layer INS4 is disposed on the source electrode SE and the drain electrode DE. The fourth insulating layer INS4 covers the source electrode SE and the drain electrode DE. The fourth insulating layer INS4 may be a via layer. The fourth insulating layer INS4 may include a same material as the third insulating layer INS3 or may include at least one material selected from the materials listed above as the materials of the third insulating layer INS3.

The fourth insulating layer INS4 may be disposed entirely to cover all of the third insulating layer INS3, the source electrode SE and the drain electrode DE.

The data line E3 and the connection electrode E4 are disposed on the fourth insulating layer INS4. The data line E3 and the connection electrode E4 may be a source/drain conductive layer. The data line E3 may be electrically connected to the source electrode SE of the transistor TR through a contact hole defined through the fourth insulating layer INS4 in the pixel. The connection electrode E4 may be electrically connected to the drain electrode DE of the transistor TR through the contact hole defined through the fourth insulating layer INS4.

The data line E3 and the connection electrode E4 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The data line E3 and the connection electrode E4 may be defined by a single film or a stack of multiple films. The data line E3 and the connection electrode E4 may be made of, but is not limited to, a same material as the source electrode SE and the drain electrode DE.

The data line E3 and the connection electrode E4 may include aluminum, which is a material having flexibility. In an embodiment, for example, the source electrode SE and the drain electrode DE, and the data line E3 and the connection electrode E4 may include a stack of Ti/Al/Ti films.

The fifth insulating layer INS5 is disposed on the data line E3 and the connection electrode E4. The fifth insulating layer INS5 may be disposed entirely to cover all of the data line E3 and the connection electrode E4.

The fifth insulating layer INS5 may be a via layer including an organic material. The fifth insulating layer INS5 may include an organic insulating material such as PAR, epoxy resin, phenolic resin, polyamide resin, PI resin, unsaturated polyesters resin, poly phenylen ether resin, poly phenylene sulfide resin, and BCB.

The buffer layer BFL and the first insulating layer INS1 to fifth insulating layer INS5 may cover most of the display area DA and the non-display area NDA of the substrate SUB. Alternatively, a part of them may be removed in the panel bending region BR to expose the surface of the substrate SUB.

The light-emitting element OLED may include a first electrode E1, a second electrode E2 and an organic emissive layer OEL, and the pixel partition wall layer PW may include a pixel-defining layer PDL and a spacer SPC.

The first electrode E1 of the light-emitting element OLED is disposed on the fifth insulating layer INS5 of the display area DA. The anode electrode of the light-emitting element OLED may be defined by or formed of the first electrode E1. The anode electrode may be electrically connected to the connection electrode E4 defined by or formed of the data line E3 and the fourth connection electrode E4 through the contact hole defined through the fifth insulating layer INS5 and may be connected to the drain electrode DE of the thin-film transistor therethrough.

The first electrode E1 may have a stack structure of a material layer having a high work function such as indium-tin-oxide ("ITO"), indium-zinc-oxide ("IZO"), zinc oxide (ZnO) and indium oxide (In₂O₃), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or a mixture thereof. A layer having a higher work function may be disposed above a reflective material layer so that the layer having the higher work function is disposed closer to the organic emissive layer OEL. The first electrode E1 may have, but is not limited to, a multilayer structure of ITO/Mg, ITO/MgF, ITO/Ag, and ITO/Ag/ITO.

The pixel partition wall layer PW may be disposed on the first electrode E1. The pixel partition wall layer PW disposed in the display area DA may include the pixel-defining layer PDL and the spacer SPC.

The pixel-defining layer PDL is disposed along the border of the organic emissive layer OEL. The pixel-defining layer PDL may be disposed on the fifth insulating layer INS and the first electrode E1. A non-emission area NPA and an emission area PA may be distinguished by the pixel-defining layer PDL.

The pixel-defining film PDL may include an organic insulating material such as PAR, epoxy resin, phenolic resin, polyamide resin, PI resin, unsaturated polyesters resin, poly phenylen ether resin, poly phenylene sulfide resin, and BCB. The pixel-defining film PDL may include an inorganic material.

The spacer SPC may be disposed on a part of the pixel-defining layer PDL. The spacer SPC may be disposed directly on the pixel-defining layer PDL. The spacer SPC may overlap the pixel-defining layer PDL in the thickness direction, and the spacer SPC may be disposed on a part of the pixel-defining layer PDL and may have a smaller width than the pixel-defining layer PDL. The spacer SPC may serve to maintain a gap with elements disposed thereabove. In an embodiment, for example, during a process of depositing an organic layer by using a fine metal mask ("FMM"), the spacer SPC may prevent sagging of the FMM. In an embodiment, the spacer SPC may also serve to support the elements stacked thereon and may reduce a deformation due to a stress applied when the display device is pressed.

The spacer SPC may include an organic insulating material like the pixel-defining layer PDL. According to an embodiment, the pixel-defining layer PDL includes or is made of a first insulating material while the spacer SPC includes or is made of a second insulating material to form a stack structure. It would be understood, however, that the disclosure is not limited thereto. According to an alternative embodiment, the pixel-defining layer PDL and the spacer SPC may be formed integrally with a same material as a single unitary indivisible part. In an embodiment, for example, the pixel-defining layer PDL and the spacer SPC having different heights or at different levels may be formed via a single process by applying a photosensitive organic material and then exposing it to light and developing it with a slit mask or a halftone mask. In such an embodiment, the boundary between the pixel-defining layer PDL and the spacer SPC may not be noticed.

The organic emissive layer OEL is disposed in the opening of the pixel-defining layer PDL of the pixel partition wall layer PW. The organic emissive layer OEL may include an organic material capable of generating one of red light, green light and blue light. The organic emissive layer OEL may generate one of red light, green light and blue light. It would be understood, however, that the disclosure is not limited thereto. The organic emissive layer OEL may produce white light by combining or materials generating red light, green light and blue light. In an embodiment, the organic emissive layer OEL may include an inorganic emissive layer including or made of an inorganic semiconductor material. In an embodiment where the organic emissive layer OEL includes an organic semiconductor material, the organic emissive layer OEL may include an organic emissive layer, a hole injection/transport layer, and an electron injection/transport layer.

The second electrode E2 is disposed on the organic emissive layer OEL. The second electrode E2 may be disposed on the organic emissive layer OEL, the pixel-defining layer PDL and the spacer SPC in the display area DPA but may not be disposed in the non-display area NDA. A cathode electrode may be defined by or formed of the second electrode E2. The cathode electrode may be disposed over throughout the display area DA. The second electrode E2 may include a material having a small work function such as Li, Ca, LiF/Ca, LiF/Al, Al, Mg, Ag, Pt, Pd, Ni, Au, Nd, Ir, Cr, BaF, Ba, or a compound or mixture thereof. The second electrode E2 may further include a transparent metal oxide layer disposed on the material layer having a small work function.

The thin-film encapsulation layer EN is disposed on the second electrode E2 of the display area DA. The thin-film encapsulation layer TFE may be disposed on the substrate SUB to cover the pixel PX.

The thin-film encapsulation layer EN may include a first encapsulation layer EN1, a second encapsulation layer EN2, and a third encapsulation layer EN3.

The first encapsulation layer EN1 is disposed on the substrate SUB to cover the light-emitting element OLED.

The first encapsulation layer EN1 may be disposed on the substrate SUB to cover the organic emissive layer OEL in the display area DA and the second electrode E2 in the non-display area NDA, and the first encapsulation layer EN1 may be spaced apart from the end of the substrate SUB by a predetermined distance.

The first encapsulation layer EN1 includes an inorganic material. In an embodiment, for example, the inorganic material of the first encapsulation layer EN1 may include one or more materials selected from silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), etc. In an embodiment, where the first encapsulation layer EN1 includes silicon oxynitride (SiON), the composition ratios of silicon (Si), oxygen (O) and nitrogen (N) of silicon oxynitride (SiON) may be different from each other. The first encapsulation layer EN1 may prevent oxygen and moisture from permeating into to the light-emitting element OLED from the outside.

The first encapsulation layer EN1 may include areas having certain surface roughness on its upper surface. The areas having such surface roughness on the upper surface of the first encapsulation layer EN1 will be described in detail later.

The second encapsulation layer EN2 is disposed on the first encapsulation layer EN1. The second encapsulation layer EN2 may be disposed to cover a first area 110 of the first encapsulation layer EN1, as will be described later, and may be spaced apart from the end of the substrate SUB by a predetermined distance.

The second encapsulation layer EN2 may be formed by curing an organic material having flowability. In an embodiment, for example, the second encapsulation layer EN2 may include an organic insulating material such as PAR, epoxy resin, phenolic resin, polyamide resin, PI resin, unsaturated polyesters resin, poly phenylen ether resin, poly phenylene sulfide resin, and BCB. The second encapsulation layer EN2 may provide a flat surface over the display area DA.

The third encapsulation layer EN3 is disposed on the first encapsulation layer EN1 to cover the second encapsulation layer EN2. Accordingly, in such an embodiment, the second encapsulation layer EN2 may be encapsulated by the first encapsulation layer EN1 and the third encapsulation layer EN3.

The third encapsulation layer EN3 may include an inorganic material different from that of the first encapsulation layer EN1. In an embodiment, for example, the third encapsulation layer EN3 may include silicon nitride (SiNx). The third encapsulation layer EN3 may prevent oxygen and moisture from permeating into to the light-emitting element OLED from the outside.

In an embodiment, as described above, since the thin-film encapsulation layer EN has the multilayer structure, even if cracks occur in any of the encapsulation layers, the cracks may not propagate between the first encapsulation layer EN1 and the second encapsulation layer EN2 or between the second encapsulation layer EN2 and the third encapsulation layers EN3. In such an embodiment, a path through which oxygen or moisture permeates into the display area DA from the outside may be effectively prevented from being formed.

Figure 5:
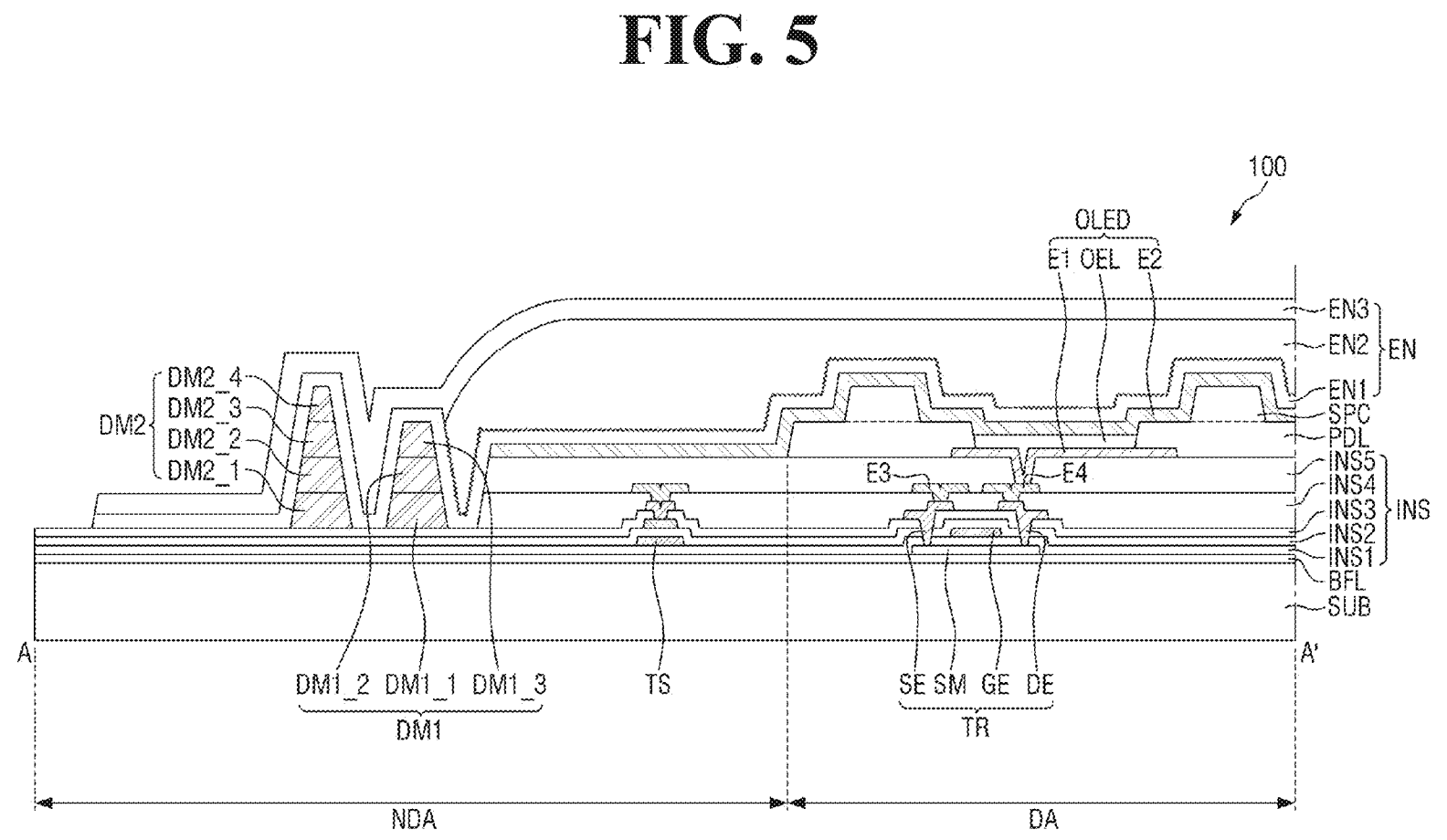
Figure 6A:
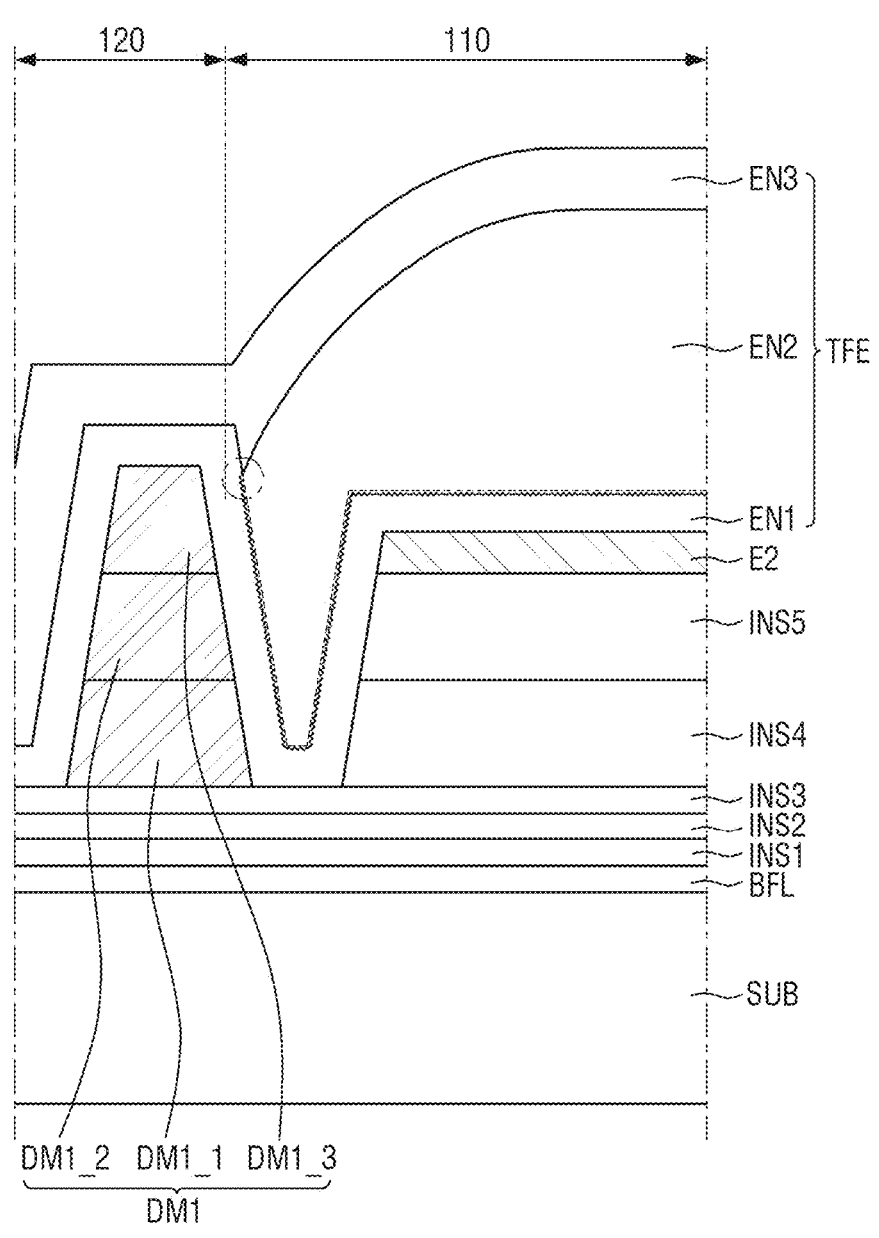
FIG. 6A is an enlarged view of an end of the first encapsulation layer shown in FIG. 5.
Figure 6B:
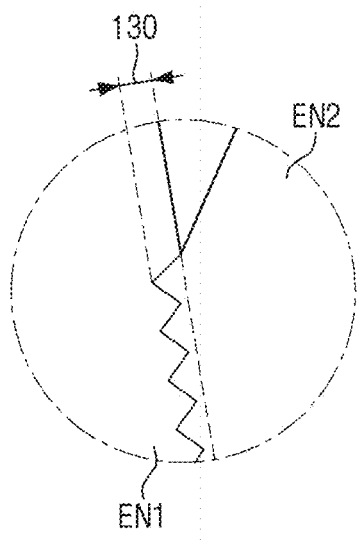
FIG. 6B is an enlarged view of the encircled portion of FIG. 6A.

Next, the cross-sectional structure of the non-display area of the display device 1 will be described. FIG. 5 is a cross-sectional view taken along line A-A' of FIG. 2. FIG. 6A is an enlarged view of an end of the first encapsulation layer shown in FIG. 5. FIG. 6B is an enlarged view of the encircled portion of FIG. 6A Referring to FIGS. 5, 6A and 6B, in an embodiment, one or more dams may be disposed on the substrate SUB of the non-display area NDA. The dams may limit the position of the organic material OR (see FIG. 10) of the second encapsulation layer EN2 so that the second encapsulation layer EN2 does not spread to the outer end of the substrate SUB.

The one or more dams may include a first dam member DM1 and a second dam member DM2. The height of each of the first and second dam members DM1 and DM2 may be defined as the distance between the lower surface and the upper surface of each of the first and second dam members DM1 and DM2. Valleys may be defined in the space between the first dam member DM1 and the second dam member DM2 and in the space between the first dam member DM1 and the fourth and fifth insulating layers INS4 and INS5, respectively.

In an embodiment, as shown in FIG. 5, the first dam member DM1 is disposed closer to the display area DA than the second dam member DM2 is. The upper surface of the second dam member DM2 located more to the outside than the first dam member DM1 may be higher than the upper surface of the first dam member DM1. The first and second dam members DM1 and DM2 may be disposed on the substrate SUB of the non-display area NDA and may surround the display area DA when viewed from the top. The fourth insulating layer INS4 may be extended from the display area DA to the non-display area NDA and may be disposed adjacent to the first dam member DM1. In such an embodiment, the fifth insulating layer INS5 may be extended to the non-display area NDA and may be disposed adjacent to the first dam member DM1 on the fourth insulating layer INS4.

Each of the first dam member DM1 and the second dam member DM2 includes at least one layer. The first dam member DM1 may include a first layer DM1_1 disposed on the substrate SUB, a second layer DM1_2 disposed on the first layer DM1_1, and a third layer DM1_3 disposed on the second layer DM1_2. The second dam member DM2 may include a first layer DM2_1 disposed on the substrate SUB, a second layer DM2_2 disposed on the first layer DM2_1, a third layer DM2_3 disposed on the second layer DM2_2, and a fourth layer DM2_4 disposed on the third layer DM2_3.

The first layer DM1_1 to third layer DM1_3 of the first dam member DM1 and the first layer DM2_1 to fourth layer DM2_4 of the second dam member DM2 may be formed using the layers used for forming the pixel structure of the display area DA. In an embodiment, for example, the first layer DM1_1 of the first dam member DM1 and the first layer DM2_1 of the second dam member DM2 may include or be made of a same material as the fourth insulating layer INS4, the second layer DM1_2 of the first dam member DM1 and the second layer DM2_2 of the second dam member DM2 may include or be made of a same material as the fifth insulating layer INS5, the third layer DM1_3 of the first dam member DM1 and the third layer DM2_3 of the second dam member DM2 may include or be made of a same material as the pixel-defining layer PDL, and the fourth layer DM2_4 of the second dam member DM2 may include or be made of a same material as the spacer SPC. The first layer DM1_1 to third layer DM1_3 of the first dam member DM1 and the first layer DM2_1 to fourth layer DM2_4 of the second dam member DM2 may be formed together with the insulating layers INS, the pixel-defining layer PDL and the spacer SPC in the display area DA, respectively. In an embodiment where the pixel-defining layer PDL and the spacer SPC are formed together in a same process, the third layer DM2_3 of the second dam member DM2 and the fourth layer DM2_4 of the second dam member DM2 may be also formed together in the same process, and the boundary between the third layer DM2_3 of the second dam member DM2 and the fourth layer DM2_4 of the second dam member DM2 may not be noticeable. Since the second dam member DM2 further includes the fourth layer DM2_4, the second dam member DM2 may be higher than the first dam member DM1 by the height of the fourth layer DM2_4 of the second dam member DM2.

In an embodiment, as described above, when the second encapsulation layer EN2 is formed, the first dam member DM1 and the second dam member DM2 may confine the organic material OR (see FIG. 10) for the second encapsulation layer EN2 so that the organic material OR does not flow to the end of the substrate SUB. In such an embodiment, the organic material OR (see FIG. 10) for the second encapsulation layer EN2 spreads from the display area DA to the periphery, and the valley between the first dam member DM1 and the fourth and fifth insulating layers INS4 and INS5 is filled with the organic material OR. When the amount and spreadability of the organic material OR (see FIG. 10) are limited to some extent, that is, set to be lower than predetermined values, the organic material OR (see FIG. 10) may not spread over the relatively high first dam member DM1 and stops spreading on the surface of the first dam member DM1. When a part of the organic material OR (see FIG. 10) flows over the first dam member DM1, the part of the organic material OR is confined in the valley between the first dam member DM1 and the second dam member DM2, and spreads no more by the high second dam member DM2. As a result, the organic material OR (see FIG. 10) for the second encapsulation layer EN2 may be effectively prevented from flowing to the edge of the substrate SUB.

In an embodiment, the second encapsulation layer EN2 may provide a flat surface over the elements thereunder in the display area DA without the organic material OR (see FIG. 10) overflowing to the edge of the substrate SUB, as described above. In such an embodiment, the organic material OR (see FIG. 10) for the second encapsulation layer EN2 may be desired to easily spread during the fabrication process to provide the flat surface. In an embodiment, as shown in FIGS. 5 and 6, the second encapsulation layer EN2 is fully applied to fill the entire display area DA on the first encapsulation layer EN1. However, as described above, if the amount and spreadability of the organic material OR is limited to some extent, the display area DA on the first encapsulation layer EN1 may not be fully filled, so that the second encapsulation layer EN2 may be applied non-uniformly.

In an embodiment, the upper surface of the first encapsulation layer EN1 may have different spreadabilities for different areas such that the organic material OR (see FIG. 10) for the second encapsulation layer EN2 has sufficient spreadability within a limited range. The spreadability of the organic material OR (see FIG. 10) for the second encapsulation layer EN2 may be controlled based on the surface roughness of the upper surface of the first encapsulation layer EN1.

In an embodiment, the upper surface of the first encapsulation layer EN1 may include a first area 110 having a first surface roughness, and a second area 120 having a second surface roughness smaller than the first surface roughness. Herein, the surface roughness (e.g., a root mean square ("RMS") roughness) may be defined as the average height deviations of the mean line, i.e., the degree of roughness.

As the surface roughness increases, the uniformity of a fluid thereon may increase, and vice versa. Accordingly, the organic material OR (see FIG. 10) for the second encapsulation layer EN2 has higher spreadability on the first area 110 with the larger first surface roughness, whereas the spreadibility is limited on the second area 120 with the second surface roughness which is relatively small.

According to an embodiment of the disclosure, the first area 110 may overlap an area where the second encapsulation layer EN2 is to be disposed, and the second area 120 may be disposed outside the first area 110.

In an embodiment, as shown in FIG. 6A, the first area 110 may be located at a position defined by the first dam member DM1 adjacent to the display area DA. In such an embodiment, the first area 110 may be extended from the display area DA to one side of the first dam member DM1 facing the display area DA. In an embodiment, for example, the edge of the first area 110 may be located on the inner surface of the first dam member DM1.

The second area 120 is in contact with the first area 110. The second area 120 is contiguous to the first area 110 and is extended from the first area 110 to the non-display area NDA. The outer edge of the second area 120 may define the outer edge of the first encapsulation layer EN1.

In an embodiment, the first area 110 may overlap the second encapsulation layer EN2, the second area 120 may not overlap the second encapsulation layer EN2, and the edge of the first area 110 may overlap the edge of the second encapsulation layer EN2. Accordingly, the first area 110 may be formed on one side of the first dam member DM1 so that the organic material OR (see FIG. 10) for the second encapsulation layer EN2 is applied thereon, while the organic material OR (see FIG. 10) may not be applied on the second area 120.

In an embodiment, as described above, the first area 110 may refer to a desired location where the organic material OR (see FIG. 10) for the second encapsulation layer EN2 is to be applied. The second area 120 may be designed so that the organic material OR (see FIG. 10) does not flow thereto. In an embodiment, the first area 110 may be formed on the side surface of the first dam member DM1 to facilitate the spread of the organic material OR (see FIG. 10) for the second encapsulation layer EN2 thereon. The second area 120 together with the first dam member DM1 and the second dam member DM2 may serve to prevent the organic material OR (see FIG. 10) from flowing to the end of the substrate SUB.

According to an embodiment of the disclosure, the first surface roughness is greater than the second surface roughness by about 5 nanometers (nm) to about 10 nm. In an embodiment, the first surface roughness may be desired to be greater than the second surface roughness by about 5 nm or more to effectively increase the spreadibility of the organic material. The difference between the first surface roughness and the second touch roughness may be less than about 10 nm to prevent decrease in the strength and disconnection of the first encapsulation layer EN1 due to too small thickness, and to suppress a path through which oxygen or moisture permeate into the display area DA from the outside when cracks occur.

In an embodiment where the difference in surface roughness is in the above-described range, the spreadability of the first area 110 may be 2.7 times to 4.1 times that of the second area 120.

In an embodiment, the surface roughness of the first area 110 and the second area 120 may be adjusted by etching. In such an embodiment, the first area 110 may have a first surface roughness that is greater than that of the second area 120 by etching. The thickness of the first encapsulation layer EN1 in the first area 110 subjected to the etching process may be smaller than the thickness of the first encapsulation layer EN1 in the second area 120 subjected to the etching process or etched less than in the first area 110. The difference in thickness between the first area 110 and the second area 120 according to the etching thickness 130 (see FIGS. 6B and 9) in the first area 110 may be in range of about 50 angstroms (Å) to about 100 (Å). In an embodiment, where the etching process is performed with the etching thickness 130 within the above range, a difference in thickness of the first encapsulation layer EN1 between the first area 110 and the second area 120 may be in a range of 1.8% to 2.6%. Such a thickness relationship between the first area 110 and the second area 120 may be effective in preventing a decrease in strength and disconnection of the first encapsulation layer EN1 due to too small thickness.

In an embodiment, the first surface roughness may be created in the first area 110 by the etching process using fluorine element, and thus the fluorine element may remain thereon. In such an embodiment, a subsequent cleaning process may be carried out to remove the fluorine element, which will be described later. In such an embodiment, an undesired reaction between the organic material OR (see FIG. 10) and fluorine element thereon may be effectively prevented by eliminating the fluorine element from the first area 110.

In an embodiment, the edge of the first area 110 may be positioned at the upper end of the inner surface (the surface facing the display area DA) of the first dam member DM1 as shown in FIGS. 5, 6A and 6B, but the disclosure is not limited thereto. Alternatively, the edge of the first area 110 may be positioned at the center or lower end of the inner surface of the first dam member DM1. in an alternative embodiment, for example, the first area 110 may be extended to the upper surface of the first dam member DM1 so that the edge may be located on the upper surface of the first dam member DM1. In another alternative embodiment, for example, the first area 110 may be disposed on the second dam member DM2 as well so that the edge may be located at the upper, the central, or the lower portion of the inner surface of the second dam member DM2 or may be located on the upper surface of the second dam member DM2.

In an alternative embodiment, the dam members may be omitted. In such an embodiment, the first area 110 may be extended from the display area DA to a part of the non-display area NDA, and the second area 120 may be extended from the edge of the first area 110 to the outer side, to control the uniformity of the second encapsulation layer EN2 without the dam members.

FIGS. 7 to 11 are cross-sectional views for illustrating a method of fabricating a display device according to an embodiment of the disclosure.

Figure 7:
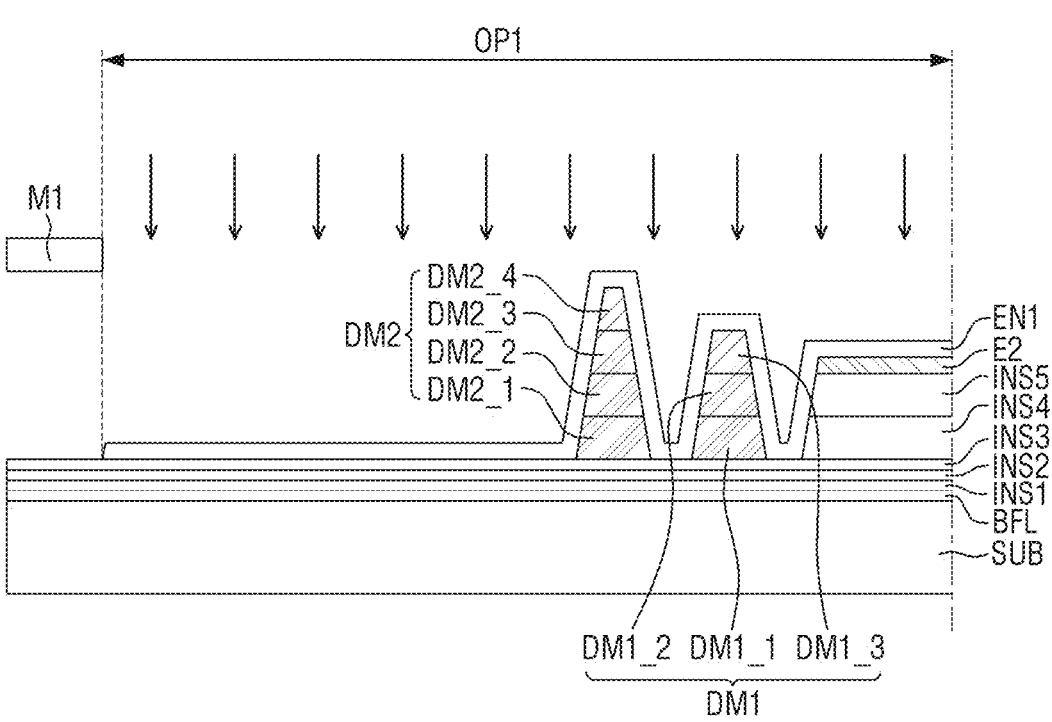
FIGS. 7 to 11 are cross-sectional views for illustrating a method of fabricating a display device according to an embodiment of the disclosure.

Referring to FIG. 7, in an embodiment of a method of fabricating a display device, a substrate SUB including a display area DA and a non-display area NDA is prepared. Although not shown in FIG. 7, a plurality of light-emitting elements OLED is provided in the display area DA of the substrate SUB, and first and second dam members DM1 and DM2 are disposed in the non-display area NDA. A variety of methods for forming the plurality of light-emitting elements OLED and the first and second dam members DM1 and DM2 are well known in the art, and, therefore, will not be described herein.

Subsequently, a first encapsulation layer EN1 is provided or formed over the substrate SUB. In an embodiment, as described above, the first encapsulation layer EN1 may be implemented as a silicon oxynitride (SiON) layer or the like. The first encapsulation layer EN1 may be formed by, for example, chemical vapor deposition.

The first encapsulation layer EN1 may be formed using an open mask. In an embodiment, as shown in FIG. 7, a first mask M1 with a first opening OP1 defining a deposition area of the first encapsulation layer EN1 is placed above the substrate SUB. The first opening OP1 of the first mask M1 may expose from the display area DA to the second dam member DM2, and may expose a part of the substrate SUB that is spaced apart from the end by a predetermined distance. Subsequently, a deposition process is carried out with the first mask M1, so that a first encapsulation layer EN1 having a same shape as the first opening OP1 when viewed from the top may be formed over the substrate SUB.

Figure 8:
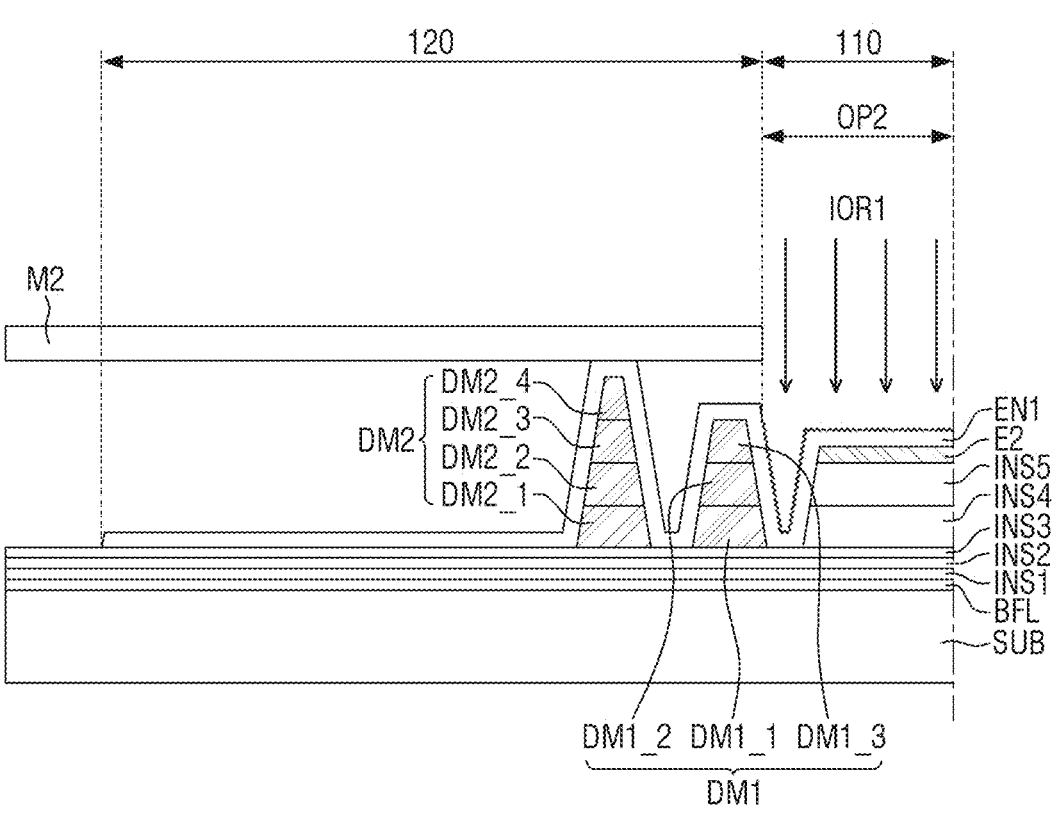

Subsequently, referring to FIG. 8, the first area 110 is formed on the first encapsulation layer EN1. The first area 110 may be formed via a partial etching process using an etching material IOR1. The etching material IOR1 may be a gas including a fluorine element, such as $CF_4$, $SF_6$ and $NF_3$. The etching material IOR1 may include or be formed of a hydrophobic material including fluorine, for example, a polymer-based hydrophobic material. It would be understood, however, that the disclosure is not limited thereto. The first area 110 may be etched with any material as long as it is hydrophobic, including fluorine. The first area 110 may be formed by, for example, plasma etching or dry etching through chemical vapor deposition.

The partial etching process may be carried out using an open mask. In an embodiment, as shown in FIG. 8, a second mask M2 with a second opening OP2 defining an etch target of the first area 100 is placed above the substrate SUB. The second opening OP2 of the second mask M2 has a shape to expose from the display area DA to the inner surface of the first dam member DM1. The outer region of the inner surface of the first dam member DM1 is masked by the second mask M2.

As the second mask M2 is placed closer to the substrate SUB on which the deposition material is provided, the etching material IOR1 may be more accurately provided to the etch target. Accordingly, in an embodiment, the second mask M2 may be placed adjacent to the first dam member DM1. In an embodiment, for example, the second mask M2 may be in contact with the upper surface of the first encapsulation layer EN1 overlapping the second dam member DM2. Subsequently, when a partial etching process is carried out with the second mask M2, the upper surface of the first encapsulation layer EN1 exposed by the second opening OP2 is etched out. The partial etching process proceeds only to a predetermined thickness rather than removing all of the first encapsulation layer EN1. As a result, the first area 100 having the first surface roughness may be formed in line with the second opening OP2. The etching thickness 130 by the partial etching process may be controlled by adjusting the etching time.

In an embodiment, for example, the first surface roughness of the first area 110 may be adjusted by adjusting the etching time by the $NF_3$ gas so that the first surface roughness of the first area 110 is greater than the second surface roughness by about 5 nm to about 10 nm.

In such an embodiment, the second area 120 is not substantially exposed to etching material IOR1, and thus the thickness of the second area 120 is not substantially changed before and after the partial etching process.

In such an embodiment, as described above, the etching time by the etching material IOR1 may be a factor for controlling the first surface roughness and the etching thickness of the first area 110, but the disclosure is not limited thereto. The first surface roughness and/or the etching thickness of the first area 110 may be adjusted by a variety of factors such as power and gas flow rate.

Figure 9:
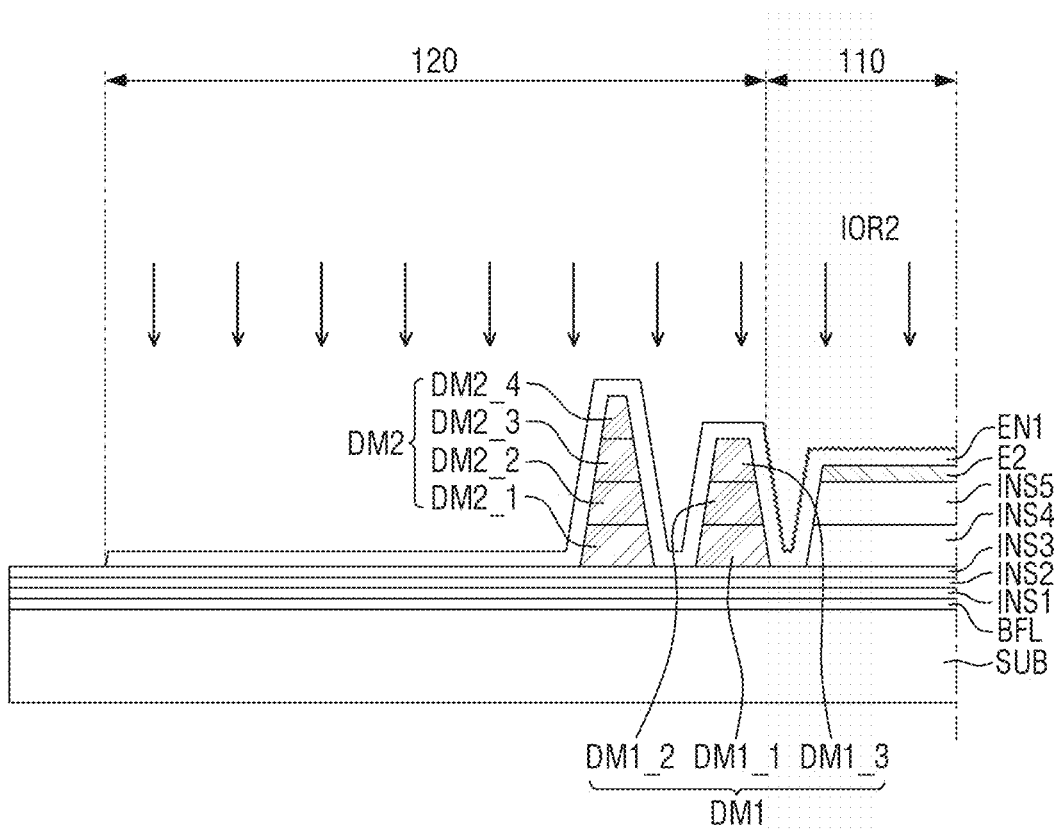

Subsequently, referring to FIG. 9, the residual fluorine element remaining on the first area 110 is removed. Fluorine may be removed with a cleaning material IOR2. The cleaning material IOR2 may be a gas including $H_2$. The cleaning process may include, for example, plasma cleaning or dry cleaning.

The cleaning process may be carried out throughout the first area 110 to the second area 120 without using a mask. Accordingly, the residual fluorine element may be completely removed not only from the first area 110 in which the residual fluorine element is highly likely to remain but also from the second area 120 in which the residual fluorine element is less likely to remain. It would be understood, however, that the disclosure is not limited thereto. Alternatively, a cleaning process may be carried out using the second mask M2 through the first opening OP1 to remove residual fluorine element from the first area 110 directly exposed to the partial etching process.

In such an embodiment, by removing the residual fluorine element from the first area 110, the reaction between the organic material OR of the second encapsulation layer EN2 to be described later and the fluorine element may be effectively prevented.

Figure 10:
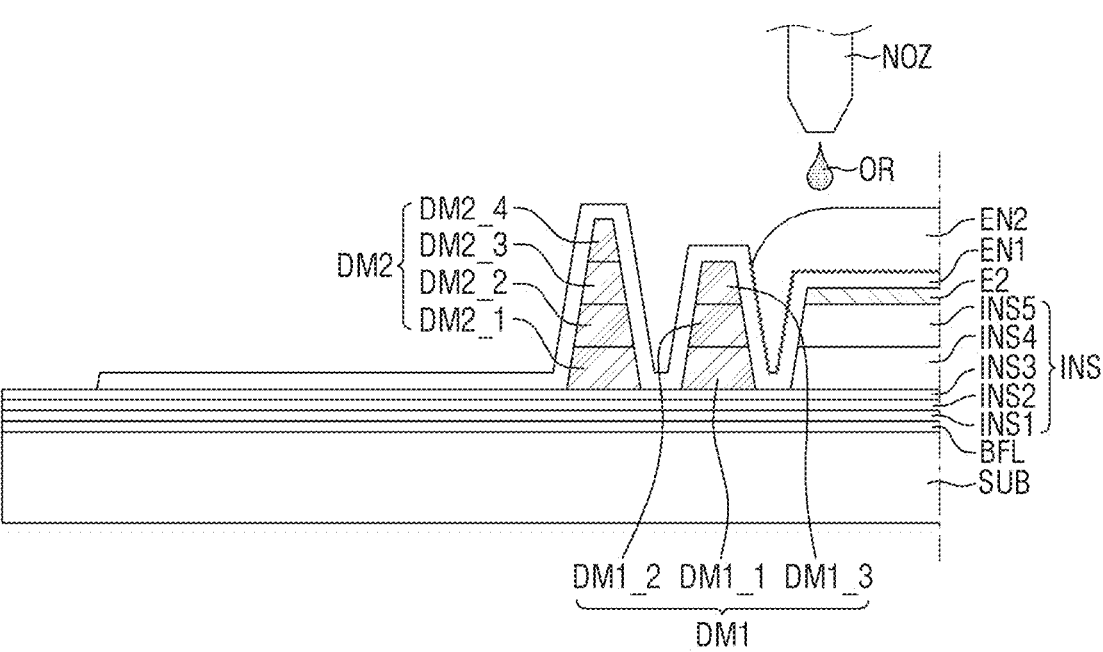

Subsequently, referring to FIG. 10, the second encapsulation layer EN2 is formed on the first encapsulation layer EN1. As described above, the second encapsulation layer EN2 may be formed as the organic material layer. The second encapsulation layer EN2 may be formed by, for example, inkjet printing. In an embodiment, for example, the second encapsulation layer EN2 may be formed on the upper surface of the first encapsulation layer EN1 by spraying liquid ink including the organic material OR through a nozzle NOZ. The liquid organic material OR sprayed on the upper surface of the first encapsulation layer EN1 may spread to a certain distance. As described above, as the surface roughness increases, the spreadibility of a fluid thereon can increase, and vice versa. Therefore, in such an embodiment, the organic material OR spreads better in the first area 110 to form a uniform film throughout the entire first area 110. While the organic material OR is accommodated in the valley between the first dam member DM1 and the insulating layers INS, the organic material OR is restricted from spreading in the second area 120 adjacent to the boundary of the first area 110 of the first encapsulation layer EN1. In such an embodiment, since the first dam member DM1 higher than the valley is located at that portion, the organic material OR may be further prevented from spreading to the outer side. Accordingly, the organic material OR may be disposed only at the desired area, and thus the organic material OR may be further effectively prevented from flowing over the substrate SUB.

Subsequently, the organic material OR is cured so that the second encapsulation layer EN2 is completed.

Finally, a third encapsulation layer EN3 is provided or formed on the first encapsulation layer EN1 to cover the second encapsulation layer EN2. In an embodiment, as described above, the third encapsulation layer EN3 may be formed as a silicon nitride (SiNx) film. The third encapsulation layer EN3 may be formed by, for example, a chemical vapor deposition.

Figure 11:
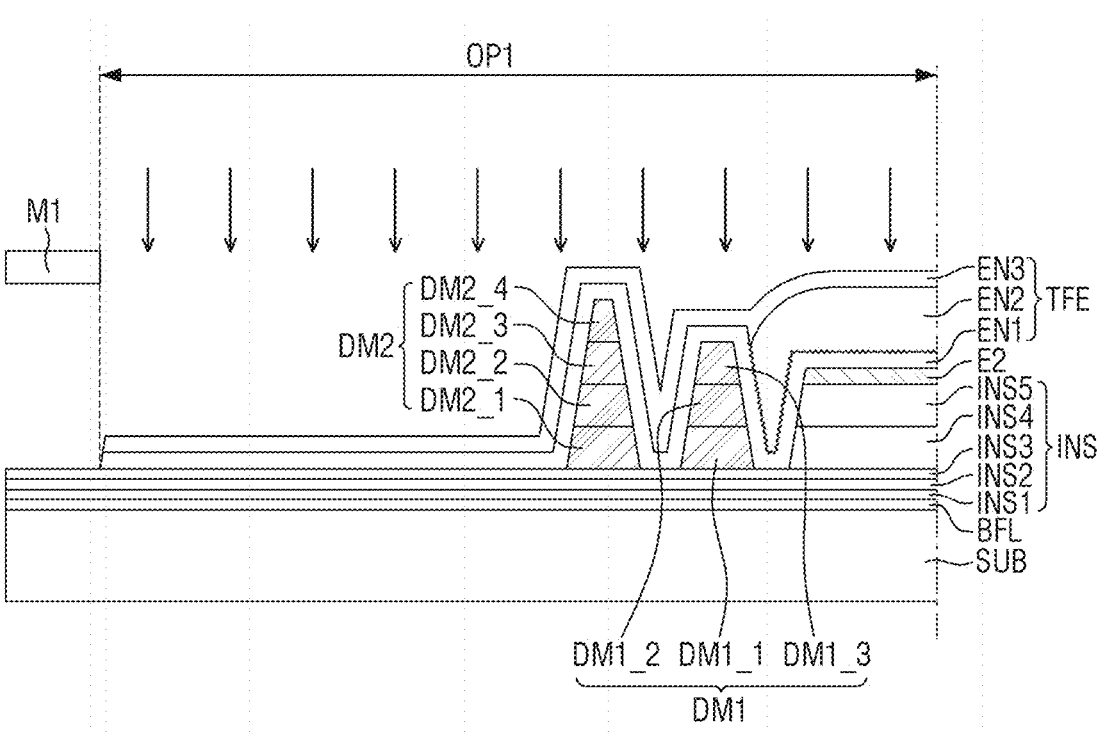

The third encapsulation layer EN3 may be formed using an open mask. In an embodiment, as shown in FIG. 11, the first mask M1 with the first opening OP1 defining a deposition area of a third encapsulation layer EN3 is placed again above the substrate SUB. The first opening OP1 of the first mask M1 may expose from the display area DA to the second dam member DM2, and may expose a part of the substrate SUB that is spaced apart from the end by a predetermined distance. Subsequently, a deposition process is carried out with the first mask M1, so that the third encapsulation layer EN3 having the same shape as the first opening OP1 when viewed from the top may be formed over the substrate SUB, thereby producing a display device 1.

Figure 12:
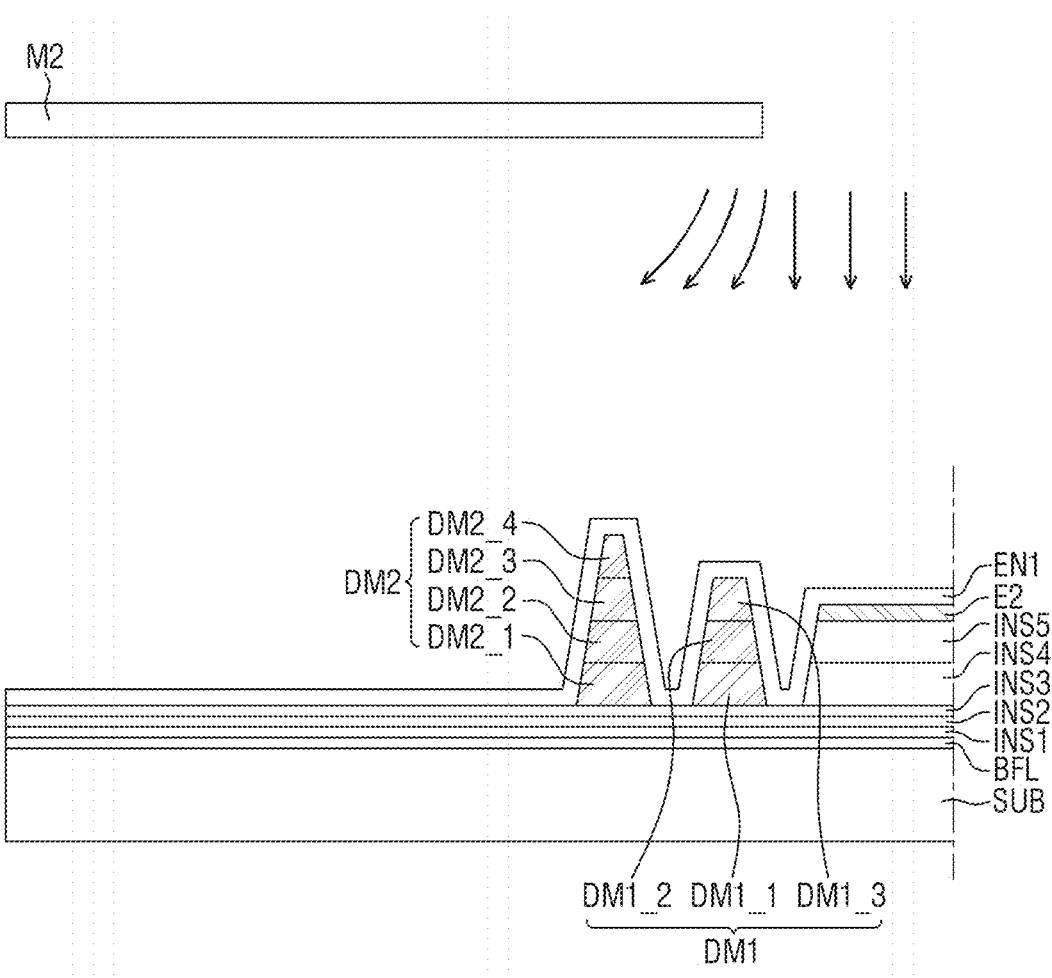
FIGS. 12 to 14 are cross-sectional views for illustrating a method of fabricating a display device according to an alternative embodiment of the disclosure.
Figure 13:
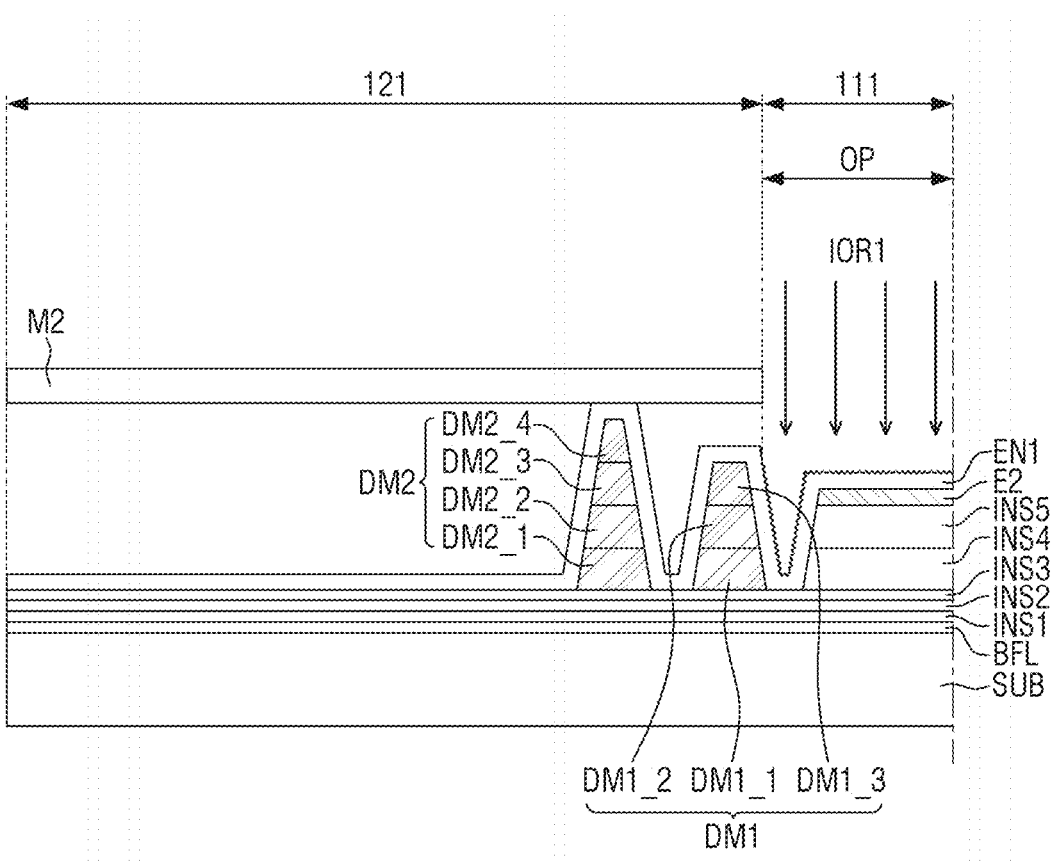
Figure 14:
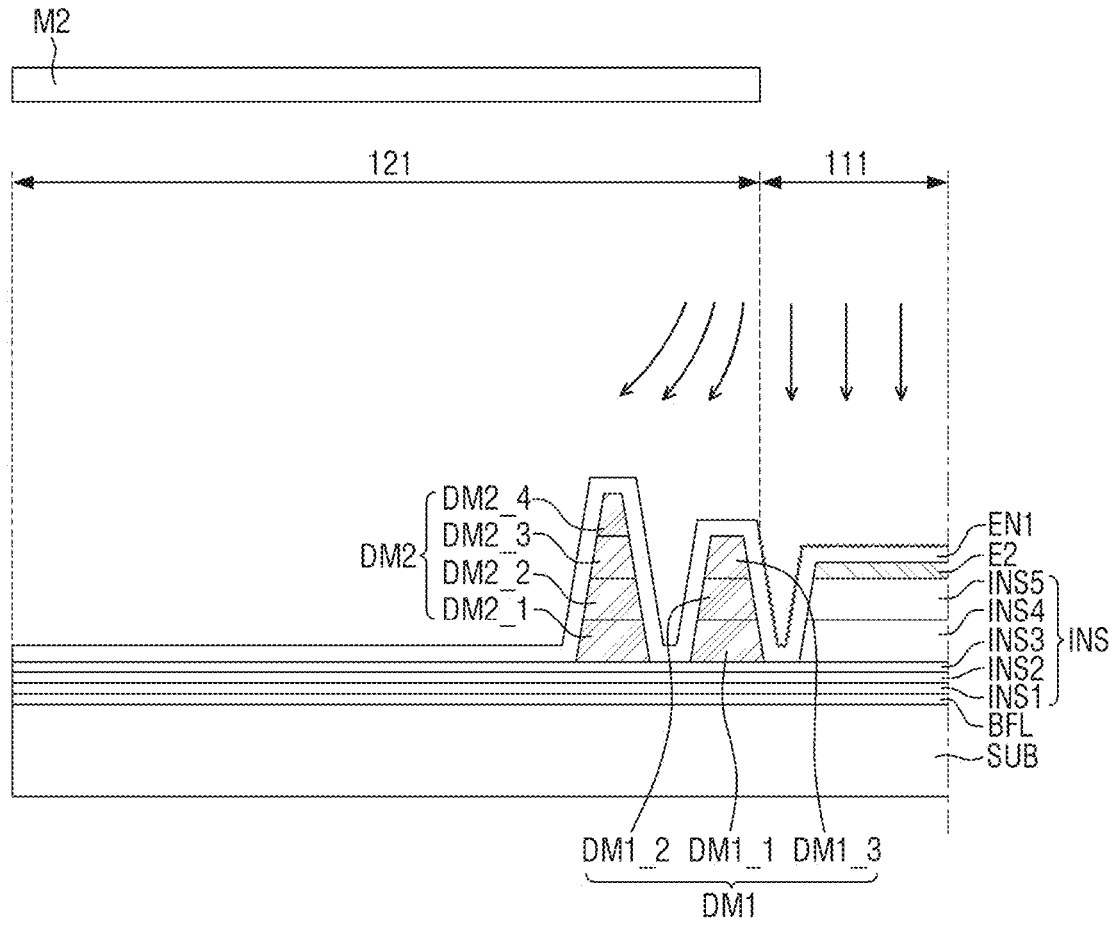

FIGS. 12 to 14 are cross-sectional views for illustrating a method of fabricating a display device according to an alternative embodiment of the disclosure.

The method of fabricating a display device shown in FIGS. 12 to 14 is substantially the same as the method of fabricating a display device shown in FIGS. 7 to 11 except that a single mask is used to form a first encapsulation layer EN1'; and, therefore, any repetitive detailed descriptions of the same or like elements will be omitted or simplified.

Referring to FIG. 12, in an embodiment of a method of fabricating a display device, a substrate SUB including a display area DA and a non-display area NDA is prepared. Although not shown in FIG. 12, a plurality of light-emitting elements OLED is provided in the display area DA of the substrate SUB, and first and second dam members DM1 and DM2 are disposed in the non-display area NDA. A variety of methods for forming the plurality of light-emitting elements OLED and the first and second dam members DM1 and DM2 are well known in the art, and, therefore, will not be described herein.

Subsequently, a first encapsulation layer EN1' is provided or formed over the substrate SUB. In an embodiment, as described above, the first encapsulation layer EN1' may be implemented as a silicon oxynitride (SiON) layer or the like. The first encapsulation layer EN1' may be formed by, for example, chemical vapor deposition.

The first encapsulation layer EN1' may be formed using an open mask. A second mask M2 with an opening OP defining a deposition area is placed above the substrate SUB. The second mask M2 is substantially the same as the second mask M2 described above with reference to FIG. 9. Accordingly, the opening OP of the second mask M2 may have a shape to expose from the display area DA to a surface of the first dam member DM1.

In such an embodiment, the second mask M2 may be placed in a vacuum chamber (not shown) for an inorganic material deposition process, and thus may be spaced apart from the substrate SUB. The second mask M2 may be substantially adjacent to the upper portion of the vacuum chamber and may be far distant from the substrate SUB. In such an embodiment, the deposition material may be diffused on the substrate SUB as if there is substantially no mask. Accordingly, the etching material IOR1 may reach the end of the substrate SUB. Subsequently, when the deposition process is carried out with the second mask M2, the first encapsulation layer EN1' may be formed up to the end of the substrate SUB.

Subsequently, referring to FIG. 13, a first area 111 is formed on the first encapsulation layer EN1'. The first area 111 may be formed via a partial etching process using an etching material IOR1. The etching material IOR1 may be substantially to the same as the etching material IOR1 described above with reference to FIG. 8.

The partial etching process may be carried out using an open mask. In an embodiment, as shown in FIG. 13, a second mask M2 with the opening OP defining an etch target of the first area 111 is placed above the substrate SUB. The opening OP of the second mask M2 has a shape to expose from the display area DA to the inner surface of the first dam member DM1. The outer region of the inner surface of the first dam member DM1 is masked by the second mask M2. The opening OP of the second mask M2 may be substantially to the same as the second opening OP2 of the second mask M2 of FIG. 8.

In such an embodiment, the second mask M2 is placed closer to the substrate SUB on which the deposition material is provided, such that the etching material may be more accurately provided to the etch target. In such an embodiment, the second mask M2 may be placed adjacent to the first dam member DM1, as described above with reference to FIG. 8.

Subsequently, referring to FIG. 14, the residual fluorine element remaining on the first area 111 is removed. Fluorine may be removed with a cleaning material (IOR2).

The cleaning material IOR2 may be a gas including H2. The cleaning process may include, for example, plasma cleaning or dry cleaning.

The cleaning process may be carried out throughout the first area 110 to the second area 120 in a state where the second mask M2 is substantially adjacent to the upper portion of the vacuum chamber and far distant from the substrate SUB, as described above with reference to FIG. 12.

Processes in which the second encapsulation layer EN2 and the third encapsulation layer EN3 are provided on the substrate SUB are substantially the same as those described above with reference to FIGS. 7 to 11; and, therefore, any repetitive detailed descriptions thereof will be omitted.

According to embodiments of the invention, the deposition of the first encapsulation layer EN1, the partial etching of the first encapsulation layer EN1 and the deposition of the third encapsulation layer EN1 may be performed using a single mask, and thus the process cost may be reduced and the process efficiency may be improved.

In such an embodiment, the organic material OR spreads better in the first area 111 but does not spread well in the second area 121 as in the above-described embodiment. Therefore, the uniformity of the organic film may be improved and the organic material OR may be effectively prevented from flowing over the substrate SUB. As a result, Mura defects in the display device 1 may be addressed.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate comprising a display area and a non-display area surrounding the display area;
a plurality of pixels disposed on the substrate in the display area;
a first encapsulation layer disposed on the substrate to cover the pixels, wherein the first encapsulation layer comprises an inorganic material;
a second encapsulation layer disposed on the first encapsulation layer, wherein the second encapsulation layer comprises an organic material; and
a third encapsulation layer disposed on the second encapsulation layer, wherein the third encapsulation layer comprises an inorganic material,
wherein an edge of the second encapsulation layer is located in the non-display area,
edges of the first encapsulation layer and the third encapsulation layer are located more to an outside than the edge of the second encapsulation layer is,
the first encapsulation layer comprises a first area having a first surface roughness and a second area having a second surface roughness smaller than the first surface roughness,
the second area is located more to the outside than the first area is, and
a thickness of the first area is smaller than a thickness of the second area.

2. The display device of claim 1,
wherein an edge of the first area is located on an inner surface of a dam member.

3. The display device of claim 1,
wherein the first area overlaps the second encapsulation layer, and the second area does not overlap the second encapsulation layer.

4. The display device of claim 3,
wherein an edge of the first area is aligned with the second encapsulation layer.

5. The display device of claim 1,
wherein the thickness of the first area is smaller than the thickness of the second area by about 50 angstroms to about 100 angstroms.

6. The display device of claim 1,
wherein the first surface roughness is greater than the second surface roughness by about 5 nanometers to about 10 nanometers.

7. A display device comprising:
a substrate comprising a display area and a non-display area surrounding the display area;
a plurality of pixels disposed on the substrate in the display area;
a first dam member disposed on the substrate in the non-display area;
a first encapsulation layer covering the pixels and the first dam member, wherein an edge of the first encapsulation layer is located on an outer side of the first dam member; and
a second encapsulation layer disposed on the first encapsulation layer and covering the pixels, wherein an edge of the second encapsulation layer is located on the first dam member,
wherein the first encapsulation layer comprises a first area disposed across the display area and the non-display area, and a second area disposed on an outer side of the first area,
the first area has a first surface roughness, and the second area has a second surface roughness different from the first surface roughness,
a boundary between the first area and the second area overlaps the first dam member, and
a thickness of the first area is smaller than a thickness of the second area.

8. The display device of claim 7,
wherein a boundary between the first area and the second area is located on an inner surface of the first dam member.

9. The display device of claim 7,
wherein the first area overlaps the second encapsulation layer, and the second area does not overlap the second encapsulation layer.

10. The display device of claim 9,
wherein the boundary between the first area and the second area is aligned with the edge of the second encapsulation layer.

11. The display device of claim 7,
wherein the thickness of the first area is smaller than the thickness of the second area by about 50 angstroms to about 100 angstroms.

12. The display device of claim 7,
wherein the first surface roughness is greater than the second surface roughness by about 5 nanometers to about 10 nanometers.

13. The display device of claim 7, further comprising:
a second dam member disposed on the outer side of the first dam member,
wherein a height of the second dam member is greater than a height of the first dam member.

14. The display device of claim 7, further comprising:
a third encapsulation layer disposed on the second encapsulation layer to cover the second encapsulation layer and the first dam member,
wherein an edge of the third encapsulation layer is located on the outer side of the first dam member.

* * * * *